United States Patent [19]

Cox et al.

[11] Patent Number: 4,789,883
[45] Date of Patent: Dec. 6, 1988

[54] INTEGRATED CIRCUIT STRUCTURE HAVING GATE ELECTRODE AND UNDERLYING OXIDE AND METHOD OF MAKING SAME

[75] Inventors: William P. Cox, Santa Clara; Mong-Song Liang, Milpitas, both of Calif.

[73] Assignee: Advanced Micro Devices, Inc., Sunnyvale, Calif.

[21] Appl. No.: 811,057

[22] Filed: Dec. 17, 1985

[51] Int. Cl.$^4$ .............................................. H01L 29/78
[52] U.S. Cl. ...................................... 357/23.7; 357/2; 357/23.5; 357/63; 148/DIG. 1
[58] Field of Search ................... 357/23.7, 23.1, 23.5, 357/63, 2

[56] References Cited

U.S. PATENT DOCUMENTS 4,499,557  2/1985  Holmberg et al. ................ 357/59 F
4,545,111  10/1985  Johnson ............................ 357/2

Primary Examiner—Robert S. Macon
Attorney, Agent, or Firm—John P. Taylor

[57] ABSTRACT

An improved electrically erasable programmable read only memory (EEPROM) integrated circuit structure and method for its fabrication is disclosed, having an enhanced interface between the floating gate electrode and the underlying tunnel oxide. The structure is capable of a relatively higher floating gate breakdown voltage and is less subject to charge migration from the floating gate and resultant charge trapping in the tunnel oxide. The improvements comprise forming the floating gate electrode from amorphous silicon and doping the silicon floating gate by implantation with a dopant, such as arsenic or phosphorus, under conditions wherein the doping agent will not easily migrate into the underlying tunnel oxide layer.

36 Claims, 4 Drawing Sheets

INTEGRATED CIRCUIT STRUCTURE HAVING GATE ELECTRODE AND UNDERLYING OXIDE AND METHOD OF MAKING SAME

BACKGROUND OF THE INVENTION

1. Field of the Invention

This invention relates to an electrically erasable programmable read only memory (EEPROM) device. More particularly, this invention relates to an improved EEPROM device having higher breakdown voltage and lower defect density, including reduced charge trapping in oxide layers and a method of making same.

2. Description of the Prior Art

In the construction of some types of EEPROMs of the MOS type, for example, using Fowler-Nordheim tunneling, an additional gate, called a floating gate, is placed between the control gate and the substrate. This floating gate is used to store a charge which changes the threshold voltage of the device. This charge must be erased or removed for the transistor to become operable under the normal bias of the control gate. The two gates are separated by a layer of oxide called an interlevel oxide. Another layer of oxide, known as a tunnel oxide, is placed between the floating gate and the underlying substrate. This tunnel oxide layer is usually less than 100 Angstroms in thickness. While MOS devices initially were constructed using, respectively, metal, oxide, and silicon layers, the metal layer has been conventionally replaced with polycrystalline silicon (polysilicon) which is doped to enhance the conductivity of the polysilicon material.

For most MOS devices, wherein the usual gate oxide layer is about 250–300 Angstroms in thickness, the use of polysilicon for the gate electrode is very satisfactory. However, when the oxide layer is very thin, as in the above described tunnel oxide layer beneath the floating gate of an EEPROM device, the uneven interface formed between the polysilicon and the thin tunnel oxide can result in unacceptably low breakdown voltages in such devices. This may be caused by virtue of the crystalline nature of the polysilicon.

This problem is best shown in the prior art illustrations of FIGS. 1A and 1B. In FIG. 1A, a silicon substrate 10, having a smooth surface, has formed thereon a thin layer of oxide 14. A layer of polysilicon 18 is deposited over oxide layer 14. As shown in exaggerated form in FIG. 1A, the lower surface 17 of polysilicon layer 18 abutting oxide layer 14 is not smooth. While the upper surface 19 of polysilicon layer 18 could be polished smooth, basically little can be done about the uneven undersurface 17.

When the structure is exposed to subsequent processing steps, including heating of the structure, oxide growth on polysilicon surface 17 as well as diffusion at the polysilicon/oxide interface can result in the structure shown in FIG. 1B wherein the uneven surface 17 of polysilicon layer 18 has been replaced by the uneven interface 16 between oxide layer 14 and polysilicon layer 18. The result is an uneven oxide thickness between silicon substrate 10 and polysilicon 18 which can allow intense electrical fields to exist in the oxide at the thinnest points and eventually cause unacceptable current leakage or breakdown across the tunnel oxide of such a device.

The use of polysilicon as the electrode requires the addition of a dopant to the polysilicon to achieve the desired conductivity. Conventionally, phosphorus oxychloride ($POCl_3$) is used to dope the polysilicon to provide a N+ type layer. However, the doping material sometimes migrates from the polysilicon into the underlying tunnel oxide which can affect oxide integrity. This causes charge trapping which will interfere with the erasable feature of the EEPROM device, and also affects the breakdown voltage of the structure. This charge migration may be due to the high concentration of the phosphorus oxychloride dopant as well as the inability to accurately control the concentration of the dopant.

It would therefore be desirable to provide an integrated circuit structure of the EEPROM type having a floating gate which will have a smoother interface between the tunnel oxide and the floating gate and which will have a lower migration of dopant into the adjoining tunnel oxide layer to reduce the occurrence of charge trapping and a method of fabricating such a structure.

SUMMARY OF THE INVENTION

It is therefore an object of this invention to provide, in an integrated circuit device having a gate electrode and an underlying gate oxide, a structure having an enhanced interface between the gate electrode and the underlying oxide.

It is yet another object of this invention to provide, in an integrated circuit device having a gate electrode and an underlying gate oxide, a structure which will inhibit migration into the underlying oxide layer.

These and other objects of the invention will be apparent from the following description and accompanying drawings.

DESCRIPTION OF THE PREFERRED EMBODIMENTS

Figure 1A:
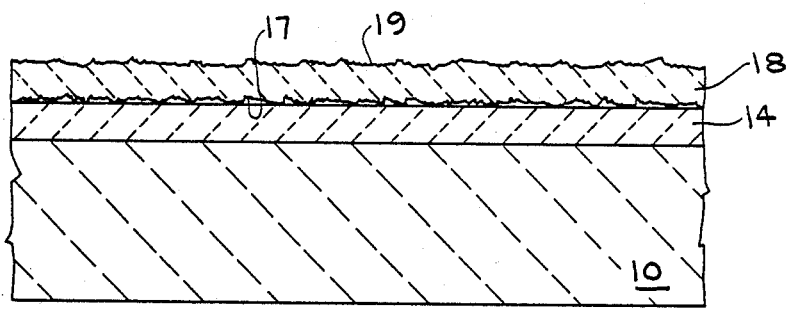
FIGS. 1A and 1B are fragmentary cross-sections of prior art structures.
Figure 1B:
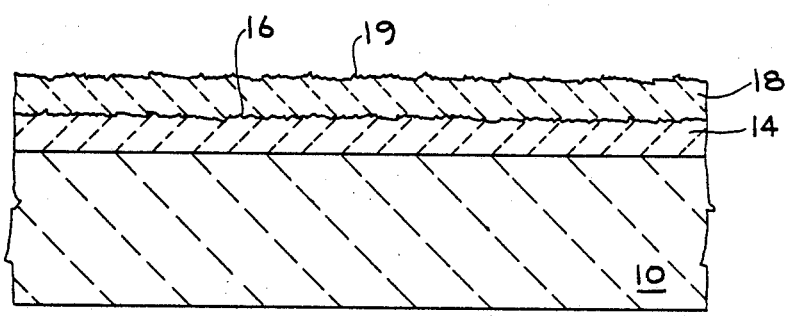
Figure 2:
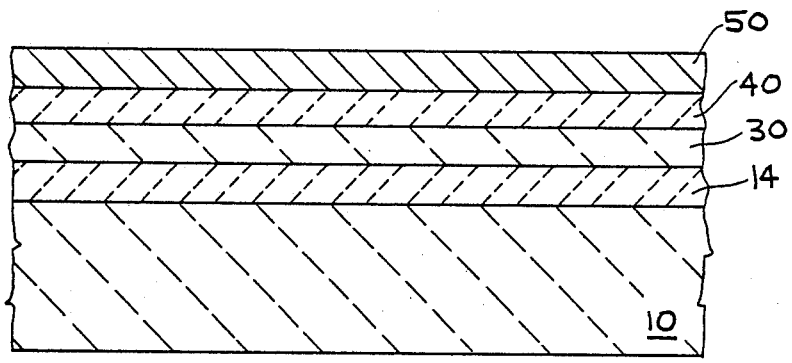
FIG. 2 is a fragmentary cross-sectional view of the structure of the invention.
Figures 3, 10:
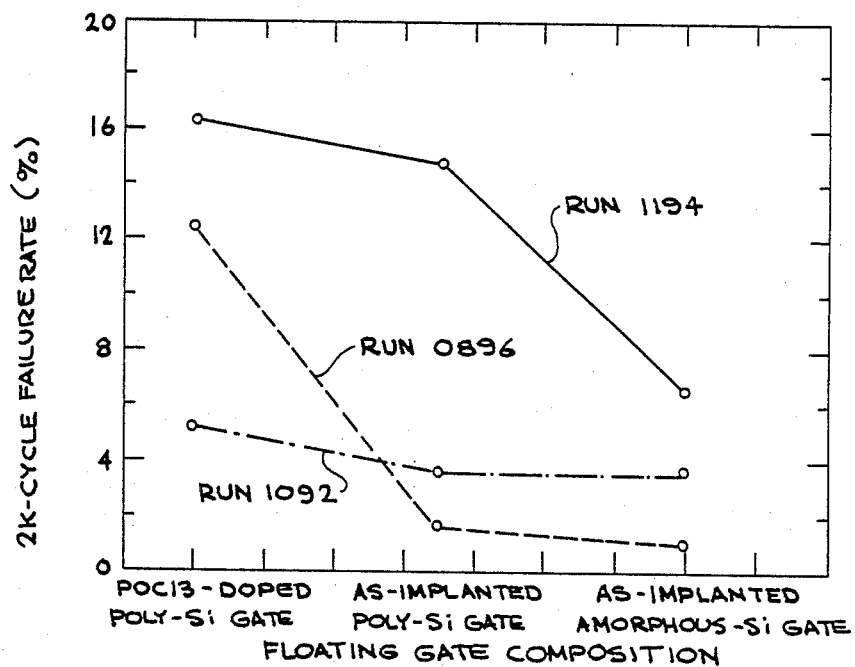
FIG. 3 is a flow sheet illustrating the process of the invention.
FIG. 10 is a graph plotting the percentage of failures of prior art devices and devices constructed in accordance with the invention when cycled two thousand times.

In accordance with the invention, as illustrated in FIGS. 2 and 3, floating gate 30 is constructed using amorphous silicon instead of the polysilicon floating gate 18 in the prior art, as illustrated in FIGS. 1A and 1B, to thereby provide a smooth interface between the amorphous silicon floating gate and the underlying tunnel oxide and increase the breakdown voltage of the tunnel oxide layer. The term "breakdown voltage", as used herein in relation to a voltage applied across the tunnel oxide layer of an EEPROM device, is intended to define the voltage at which the current through the tunnel oxide layer exceeds 1 microampere.

While the applicants are not constrained by one particular theory, it would appear that the noncrystalline nature of amorphous silicon and the absence of grain boundaries between adjoining crystals (as occurs in a polycrystalline structure) permits the formation of a surface which, without polishing or using any other planarizing techniques, provides a much smoother interface between the floating gate and the underlying oxide than the polycrystalline silicon material conventionally used. Formation of intense electrical fields at regions in the tunnel oxide where the oxide would (but for this invention) have been thinner due to irregularities in the tunnel oxide/floating gate interface are therefore avoided resulting in a higher breakdown voltage across the tunnel oxide.

In a preferred embodiment, the amorphous silicon is formed on the oxide surface 14 by depositing silicon at a temperature below the temperature at which polycrystalline silicon forms, i.e., below about 600° C. Preferably, the silicon should be deposited at a temperature of about 580° C. or less, e.g., a range of about 550° to 580° C., to insure that amorphous silicon, not polysilicon, is formed. The thickness of the amorphous silicon layer formed for a floating gate electrode for an EEPROM device should be from about 0.20 to 0.35 microns (2000 to 3500 Angstroms), preferably about 0.25 microns (2500 Angstroms).

As shown in FIG. 2, subsequent to the formation of amorphous silicon floating gate layer 30, an interlevel oxide layer 40 is formed over layer 30 followed by control gate layer 50, which may comprise a metal layer. Formation of floating gate layer 30 from amorphous silicon then provides an additional benefit in the formation of a smooth interface between floating gate layer 30 and interlevel oxide layer 40.

To further enhance the performance of the device, particularly with respect to charge trapping which may prevent erasure, amorphous silicon layer 30 is doped by ion implantation using an arsenic or a phosphorus dopant, but preferably arsenic as will be discussed below. Subsequent heating of the amorphous layer to redistribute the dopants more uniformly or any other heating of the structure during subsequent fabrication steps, will not result in migration of the dopant into the underlying oxide layer 14 or, for that matter, into interlevel oxide layer 40, because of the implantation conditions. Migration of the doping agent may be further inhibited, in the practice of the preferred embodiment, by implantation with arsenic ions, presumably due to the size of the arsenic ion compared to the phosphorus ion.

The arsenic implantation of amorphous silicon layer 30 is carried out using a concentration of from about $1.75 \times 10^{15}$ to about $2.5 \times 10^{16}$ atoms per square centimeter. If a phosphorus dopant is implanted, the dosage should be from about $5 \times 10^{15}$ to about $2 \times 10^{16}$ atoms per square centimeter, preferably about $1 \times 10^{16}$ atoms per square centimeter. The implantation voltage will depend upon the thickness of the amorphous silicon layer. Typically, for a 0.25 micron thick amorphous silicon floating gate, the implantation voltage should be about 50 KEV for arsenic or 30 KEV for phosphorus.

After implantation, the implanted silicon is heated to a temperature of from about 950° to about 1100° C., typically, about 1000° C. for about 45 minutes to 2 hours, typically about 1 hour, with the longer time period used for the lower temperature to redistribute the dopant more uniformly as well as to alleviate any damage done during the implantation step. The exact time and temperature used will also be dependent upon the level of dopant used.

It should be noted that while the invention, in the preferred embodiment, comprises a combination of the use of amorphous silicon as the floating gate material to provide a smoother interface with adjoining oxides, and the use of an implanted dopant such as phosphorus or, preferably, arsenic, to improve the conductivity of the silicon while inhibiting migration of the dopant into the adjoining oxides, the use of either the amorphous silicon or the implanted dopant alone in the construction of an EEPROM device will result in an improved device. Thus the use of either the amorphous silicon floating gate or the arsenic doped floating gate alone is within the contemplation of this invention.

To further illustrate the invention, a number of EEPROM devices were constructed, respectively, using a polysilicon floating gate conventionally doped with $POCl_3$ at a concentration of about $1 \times 10^{18}$ atoms per square centimeter (representing the prior art), a polysilicon floating gate doped with arsenic, implanted at 50 KEV at a concentration of from $1.75 \times 10^{15}$ to $2.5 \times 10^{16}$ atoms per square centimeter, and an amorphous silicon floating gate similarly doped with arsenic.

The devices were tested to determine the average breakdown voltage of the three classes of devices. Breakdown voltage was determined by measuring the current flowing across the tunnel oxide between the silicon substrate and the floating gate. The voltage at which a current of 1 microamp was measured was defined as the breakdown voltage of the oxide layer.

Figure 4:
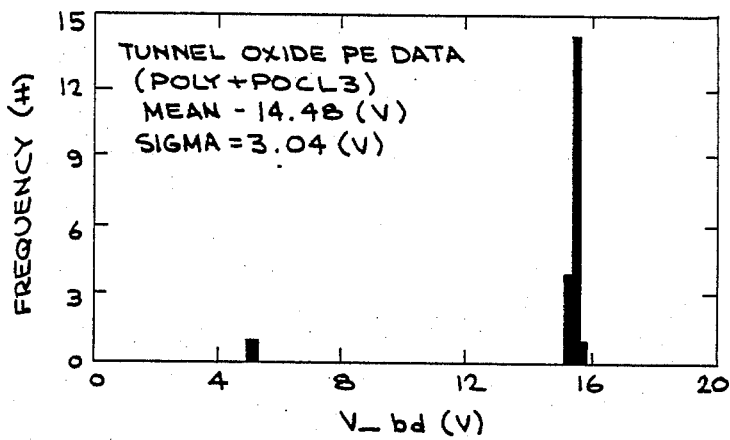
FIG. 4 is a graph illustrating average breakdown voltages across the tunnel oxide for EEPROM devices constructed in accordance with the prior art.
Figure 5:
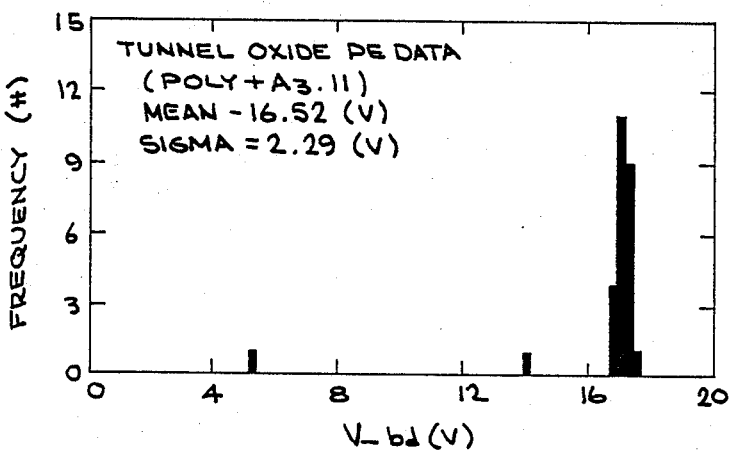
FIG. 5 is a graph illustrating average breakdown voltages across the tunnel oxide for EEPROM devices constructed with a polysilicon floating gate doped by arsenic implantation.
Figure 6:
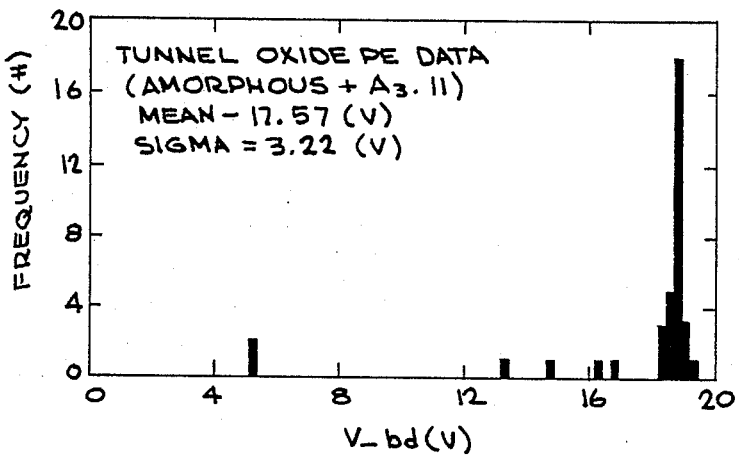
FIG. 6 is a graph illustrating average breakdown voltages across the tunnel oxide for EEPROM devices constructed with an amorphous silicon floating gate doped by arsenic implantation.

The results are shown in the graphs of FIGS. 4 to 6 which each plot breakdown voltages against the number of devices reaching the 1 microamp current level at that particular voltage. The Sigma or standard deviation shown in the graphs indicate that the results are consistent among the devices tested.

FIG. 4 shows the results for the prior art structures constructed using a polysilicon floating gate doped with a conventional phosphorus oxychloride dopant. FIG. 5 shows that some improvement in average breakdown voltage occurs when the polysilicon is doped by implantation with arsenic in accordance with the invention. FIG. 6 shows even further improvement in the average breakdown voltage when the amorphous silicon floating gate of the invention is used instead of the prior art polysilicon material in the floating gate.

Figure 7:
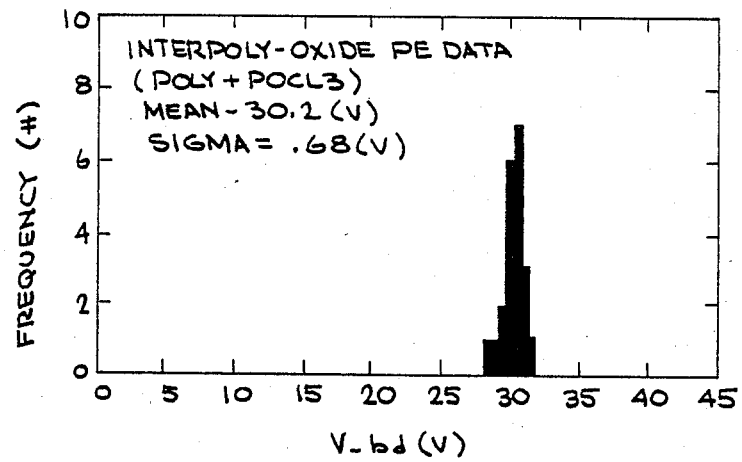
FIG. 7 is a graph illustrating average breakdown voltages across the interlevel oxide for EEPROM devices constructed in accordance with the prior art.
Figure 8:
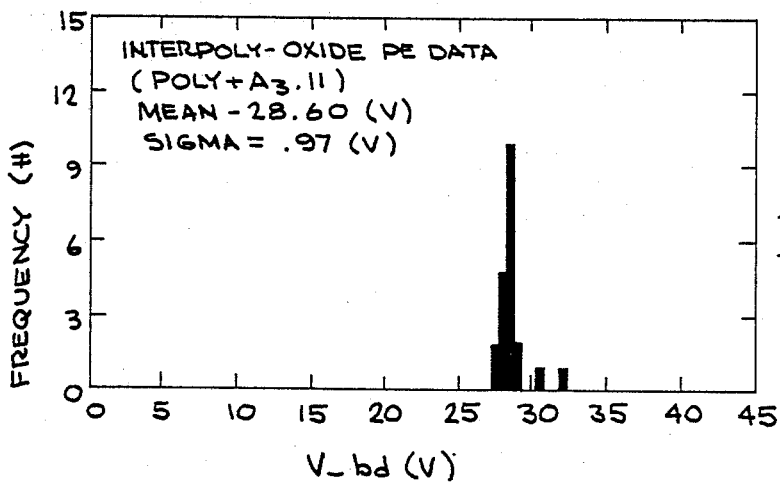
FIG. 8 is a graph illustrating average breakdown voltages across the interlevel oxide for EEPROM devices constructed with a polysilicon floating gate doped by arsenic implantation.
Figure 9:
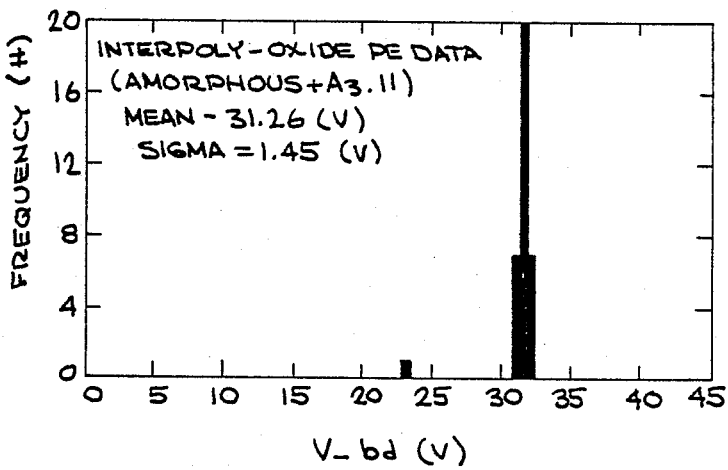
FIG. 9 is a graph illustrating average breakdown voltages across the interlevel oxide for EEPROM devices constructed with an amorphous silicon floating gate doped by arsenic implantation.

Another group of devices, constructed in the same respective manner, were tested to determine the effect of the improvements of the invention on breakdown voltage between the floating gate and the control gate through the interlevel oxide therebetween. FIGS. 7 through 9 illustrate the average breakdown voltage plotted against the number of devices exhibiting 1 microamp of current flow across the oxide layer at the particular voltage level.

FIG. 7 shows the results for devices representing the prior art construction of a polysilicon floating gate conventionally doped with a phosphorus oxychloride dopant as described above with respect to FIG. 4, while FIG. 8 depicts the test results for devices constructed with polysilicon floating gates doped by implantation with arsenic as previously described. FIG. 9 shows the test results for devices constructed with amorphous silicon floating gates doped by implantation with arsenic. The results indicate that the devices, constructed in accordance with the invention, maintain similar or better quality in the breakdown voltage levels across the interlevel oxide layer between the floating gate and the control gate compared to the test results shown in FIG. 7 for the prior art constructions.

FIG. 10 illustrates further testing of the devices just described by cycling the devices through on and off states two thousand times. Percentages of failures are shown for each of the three types of devices previously described with respect to FIGS. 4–6. It will be noted that for each of the three runs, the percentage of failures for the devices constructed in accordance with the invention is lower than the prior art devices.

Thus, the invention provides an improved integrated circuit device having improved charge trapping characteristics and wherein the average breakdown voltage across the gate oxide, particularly the tunnel oxide layer of an EEPROM device, is increased by constructing the conducting layer above the gate oxide using amorphous silicon to provide a more planarized interface with adjoining oxide layers. The silicon gate electrode is preferably doped by implantation with arsenic or phosphorus instead of conventional chemical doping with phosphorus oxychloride to further increase the average breakdown voltage and to inhibit charge migration into the adjoining oxide layers which, in the case of an EEPROM device, can cause problems in the form of charge trapping in the tunnel oxide layer.

Having thus described the invention, what is claimed is:

1. An improved MOS type integrated circuit structure, having a gate electrode over a gate oxide, wherein said gate electrode comprises an amorphous silicon material.

2. The structure of claim 1, wherein said MOS type structure comprises an EEPROM device having a floating gate electrode and a tunnel oxide, said gate electrode comprises said floating gate electrode of said EEPROM device, and said gate oxide beneath said gate electrode comprises said tunnel oxide of said EEPROM device.

3. The structure of claim 2 wherein said amorphous silicon floating gate is doped such that migration of the dopant into said tunnel oxide and charge trapping in said tunnel oxide is inhibited.

4. The structure of claim 3 wherein said amorphous silicon floating gate is doped by implantation of arsenic ions.

5. The structure of claim 3 wherein said amorphous silicon floating gate is doped by implantation of phosphorus ions.

6. An improved integrated circuit structure, wherein a gate electrode formed over a gate oxide in an MOS type device comprises a silicon material doped with a doping agent to enhance the conductivity of said silicon material such that migration of said doping agent into adjoining oxide layers is inhibited.

7. The structure of claim 6, wherein said MOS type device comprises an EEPROM device having a tunnel oxide, said gate electrode comprises a floating gate of said EEPROM device, said gate oxide comprises said tunnel oxide of said EEPROM device, and said doping agent comprises a material selected from the group consisting of arsenic and phosphorus implanted into said floating gate at a concentration and an energy level which will inhibit migration of said doping agent into the adjoining tunnel oxide of said EEPROM device whereby charge trapping in said tunnel oxide will be inhibited.

8. The structure of claim 7 wherein said silicon material comprises amorphous silicon.

9. An improved integrated circuit structure wherein the gate electrode formed over the gate oxide in an MOS type device is formed from amorphous silicon.

10. The structure of claim 9 wherein said MOS type device comprises an EEPROM device having a tunnel oxide, said gate electrode formed from amorphous silicon comprises a floating gate of said EEPROM device, and said gate oxide comprises said tunnel oxide of said EEPROM device.

11. The structure of claim 10 wherein the conductivity of said amorphous silicon floating gate is enhanced by implantation of a dopant under conditions which will not favor migration of the dopant into the underlying tunnel oxide whereby charge trapping in said tunnel oxide is inhibited.

12. The structure of claim 11 wherein said amorphous silicon floating gate is doped by implantation with arsenic to enhance the conductivity of the amorphous silicon while inhibiting charge migration of the dopant into the adjoining tunnel oxide to inhibit charge trapping in said tunnel oxide.

13. The structure of claim 11 wherein said amorphous silicon floating gate is doped by implantation with phosphorus to enhance the conductivity of the amorphous silicon while inhibiting charge migration of the dopant into the adjoining tunnel oxide to inhibit charge trapping in said tunnel oxide.

14. An improved integrated circuit structure wherein a gate electrode formed over a gate oxide in an MOS type device comprises a silicon material which is doped by implantation of a doping agent to enhance the conductivity of said silicon material under conditions which will inhibit migration of the doping agent into adjoining oxide layers.

15. The structure of claim 14 wherein said MOS type device comprises an EEPROM device having a floating gate and a tunnel oxide layer, said gate electrode formed from said silicon material comprises said floating gate of said EEPROM device, said gate oxide comprises said tunnel oxide layer of said EEPROM device, and said doping agent comprises a material selected from the group consisting of arsenic and phosphorus implanted into said floating gate at a concentration and an energy level which will inhibit migration of said doping agent into said tunnel oxide layer of said EEPROM device whereby charge trapping in said tunnel oxide layer will be inhibited.

16. The structure of claim 15 wherein said silicon material comprises amorphous silicon.

17. A method of constructing an EEPROM device having an improved breakdown voltage across a gate oxide therein which comprises: forming a floating gate electrode from amorphous silicon to provide an enhanced interface between said floating gate electrode and said gate oxide to thereby increase the breakdown voltage of said gate oxide.

18. The method of claim 17 which comprises the further step of doping said amorphous silicon floating gate electrode to increase the conductivity thereof by introduction of a doping agent under conditions which will not favor migration of said doping agent into said gate oxide whereby charge trapping in said gate oxide will be inhibited.

19. The method of claim 18 wherein said doping comprises: implantation doping of said amorphous silicon with a doping agent selected from the group consisting of arsenic and phosphorus.

20. A method of constructing an improved integrated circuit structure having a higher breakdown voltage across a gate oxide therein which comprises forming over said gate oxide a gate electrode from an amorphous silicon material to form a more uniform interface between said gate electrode and said gate oxide.

21. The method of claim 20 wherein said integrated circuit structure comprises an EEPROM device and said step of forming a gate electrode over said gate oxide comprises forming over a tunnel oxide a floating gate electrode from amorphous silicon to provide an enhanced interface between said floating gate electrode and said tunnel oxide to thereby increase the breakdown voltage across said tunnel oxide.

22. An improved method of constructing an EEPROM device characterized by: forming a floating gate over a tunnel oxide layer using a material which will form a relatively smooth interface with the underlying tunnel oxide to provide an improved breakdown voltage of said tunnel oxide.

23. The improved method of claim 21 wherein the step of forming a floating gate using a material which will form a smooth interface with the underlying tunnel oxide layer comprises forming an amorphous silicon floating gate.

24. The method of claim 23 wherein said step of forming an amorphous silicon floating gate further comprises depositing a layer of silicon on said tunnel oxide layer at a temperature below the temperature at which polycrystalline silicon forms.

25. The method of claim 24 wherein said step of forming said amorphous silicon floating gate further comprises depositing said silicon over said tunnel oxide layer at a temperature of less than about 600° C.

26. The method of claim 25 wherein said step of forming said amorphous silicon floating gate further comprises depositing said silicon at a temperature of from 550° to 580° C.

27. The method of claim 26 wherein said step of forming said amorphous silicon floating gate further comprises depositing said layer of amorphous silicon to a thickness of from about 0.20 to about 0.35 microns.

28. The method of claim 27 wherein said step of forming said amorphous silicon floating gate further comprises depositing said layer of amorphous silicon to a thickness of approximately 0.25 microns.

29. The improved method of claim 28 wherein said step of forming said floating gate over a tunnel oxide layer using a material which will form a smooth interface with the underlying tunnel oxide to provide an improved breakdown voltage across the tunnel oxide layer further comprises the steps of depositing a silicon layer and then doping said silicon layer to improve the conductivity of the silicon by implantation into said silicon of a doping agent under conditions which will inhibit migration of said doping agent into the underlying tunnel oxide layer to inhibit charge trapping in said tunnel oxide layer.

30. The method of claim 29 wherein said step of forming said silicon floating gate further comprises depositing said layer of silicon to a thickness of from about 0.20 to about 0.35 microns, and said step of doping said silicon by implantation comprises implanting a doping agent selected from the group consisting of arsenic and phosphorus.

31. The method of claim 30 wherein said step of doping said silicon by implantation further comprises implanting arsenic at a concentration of $1.75 \times 10^{15}$ to $2.5 \times 10^{16}$ atoms per square centimeter at an energy level of about 50 KEV.

32. The method of claim 31 including the further step of annealing the implanted silicon at a temperature of from about 950° to about 1100° C. for from about 45 minutes to about 2 hours.

33. The method of claim 32 wherein said step of forming said silicon floating gate further comprises depositing a layer of amorphous silicon over said tunnel oxide layer at a temperature of less than about 600° C. to prevent formation of polycrystalline silicon to thereby form a smooth interface between said floating gate and said tunnel oxide layer to provide a higher breakdown voltage across said tunnel oxide layer.

34. The method of claim 33 wherein said step of doping said silicon by implantation further comprises implanting phosphorus at a concentration of from about $5 \times 10^{15}$ to about $2 \times 10^{16}$ atoms per square centimeter at an energy level of about 30 KEV.

35. The method of claim 34 including the further step of annealing the implanted silicon at a temperature of from about 950° to about 1100° C. for from about 45 minutes to about 2 hours.

36. The method of claim 35 wherein said step of forming said silicon floating gate further comprises depositing a layer of amorphous silicon over said tunnel oxide layer at a temperature of less than about 600° C. to prevent formation of polycrystalline silicon to thereby form a smooth interface between said floating gate and said tunnel oxide layer to provide a higher breakdown voltage across said tunnel oxide layer.

* * * * *